(12) United States Patent
Baik et al.

(10) Patent No.: US 7,682,652 B2
(45) Date of Patent: Mar. 23, 2010

(54) SURFACE TREATMENT METHOD, CIRCUIT LINES FORMATION METHOD, CIRCUIT LINES FORMATION APPARATUS, AND PRINTED CIRCUIT BOARD FORMED THEREBY

(75) Inventors: Yoon-Ah Baik, Suwon-si (KR); Hyun-Chul Jung, Suwon-si (KR)

(73) Assignee: Samsung Electro-Mechanics Co., Ltd, Suwon-si (KR)

(*) Notice: Subject to any disclaimer, the term of this patent is extended or adjusted under 35 U.S.C. 154(b) by 1002 days.

(21) Appl. No.: 11/278,205

(22) Filed: Mar. 31, 2006

(65) Prior Publication Data

US 2006/0223316 A1 Oct. 5, 2006

(30) Foreign Application Priority Data

Apr. 1, 2005 (KR) .................. 10-2005-0027508

(51) Int. Cl.
*B05D 5/12* (2006.01)
(52) U.S. Cl. ........................... 427/58; 427/96.1
(58) Field of Classification Search .............. 427/58, 427/96.1
See application file for complete search history.

(56) References Cited

U.S. PATENT DOCUMENTS

2004/0263564 A1* 12/2004 Maekawa et al. ............. 347/40

FOREIGN PATENT DOCUMENTS

| JP | 64-5095 | 1/1989 |
| JP | 2003-149831 | 5/2003 |
| JP | 2005/512766 | 5/2005 |

OTHER PUBLICATIONS

JP 2005-045236 to Yanagimoto et al. (translation).*
JP 2005-045236A (Feb. 17, 2005).*
Japanese Office Action dated Feb. 20, 2008 issued in JP 2006-66742.
Japanese Office Action issued Nov. 20, 2008 in Japanese Application No. 2006-066742.
Japanese Patent Application Gazette No. JP 2005-045236A (Feb. 17, 2005) ('Inorganic Thin Film Pattern Forming Method of Polyimide Resin').
Japanese Patent Application Gazette No. JP 2005-051216A (Feb. 24, 2005) ('Droplet Dispenser and Method of Forming Pattern').
Korean Office Action dated Aug. 29, 2006 issued in KR 2005-27508.

* cited by examiner

*Primary Examiner*—Roberts Culbert
(74) *Attorney, Agent, or Firm*—Stanzione & Kim, LLP

(57) ABSTRACT

The present invention relates to a method of surface treatment, a method for forming circuit lines, a printed circuit board formed thereby, and an apparatus for forming circuit lines on a substrate, wherein fine circuit lines are formed simply, rapidly, and economically. The method for forming circuit lines of the present invention comprises: (a) selectively applying a surface treatment solution which includes an alkali metal compound on a base film in accordance with circuit patterns by a discharging method; (b) applying a conductive ink which includes metal nanoparticles in accordance with the surface-treated circuit pattern; and (c) curing the base film on which the conductive ink is applied under a reduction atmosphere lines.

10 Claims, 5 Drawing Sheets

SURFACE TREATMENT METHOD, CIRCUIT LINES FORMATION METHOD, CIRCUIT LINES FORMATION APPARATUS, AND PRINTED CIRCUIT BOARD FORMED THEREBY

CROSS-REFERENCE TO RELATED APPLICATIONS

This application claims the benefit of Korean Patent Application No. 2005-0027508, filed on Apr. 1, 2005, with the Korea Intellectual Property Office, herein incorporated by reference in its entirety.

BACKGROUND OF THE INVENTION

1. Field of the Invention

The present invention relates to a method of surface treatment, a method for forming circuit lines, an apparatus for forming circuit lines, and a printed circuit board formed thereby.

2. Description of the Related Art

There are two kinds of conventional methods for forming circuit lines on a substrate of which one is a substractive process forming circuit lines by etching a copper layer and the other is an additive process forming circuit lines by plating with copper on a bare dielectric material. Both methods require a photoresist film for forming a circuit pattern on a substrate, and exposure and development steps of the photoresist film. Especially, the substractive process requires a longer etching step of the copper layer. These methods have some drawbacks: 1) the copper layer in the substractive process must be introduced to a whole space of the substrate, whether or not circuit lines are formed, so that it becomes costly and low efficient, and 2) these processes require the steps of providing a photoresist film and removing it later, so that the manufacturing time becomes longer and the manufacturing process becomes complicate and inefficient. Further, these processes cannot provide fine circuit lines.

To overcome the drawbacks associated with above mentioned conventional processes, a method for forming fine circuit lines is suggested by an inkjet process, which forms circuit lines by applying a conductive ink on a substrate in accordance with a circuit pattern. The method for forming fine circuit lines by the ink-jet process does not require a photoresist film or an etching step, and can form fine circuit lines. However, it also has a drawback that a bonding power between the substrate and the circuit lines is weak, so that it deteriorates an electric reliability.

To solve the defects associated with the method for forming fine circuit lines by the ink-jet process, referring to FIG. 1, it shows cross-sectional views of a substrate for forming circuit lines on a printed circuit board by using a laser beam. This laser process for forming conductive circuit lines comprises the steps for forming a waterproofing layer 150 on a whole surface of a base film 110, removing the waterproofing layer by the laser beam in accordance with a circuit pattern, and applying a conductive ink 170 on parts of a substrate where the waterproofing layer is removed. The laser process requires an extra apparatus of generating the laser beam which is expensive and the extra steps for forming and removing the waterproofing layer, so that it becomes inconvenient and inefficient.

It would therefore be desirable to have an improved method for forming fine circuit lines and printed circuit board made thereby.

SUMMARY OF THE INVENTION

The present invention was invented to overcome the defects associated with conventional technologies, and it is an object of the present invention to provide a method of surface treatment on a substrate which may treat not a whole surface of the substrate but a surface of circuit patterns selectively, so that the manufacturing process may be simplified and the manufacturing cost may be reduced.

It is another object of the present invention to provide a method for forming circuit lines on a substrate which may form fine circuit lines by a simplified process including the above mentioned method of surface treatment, which do not require a photoresist film or an etching process.

It is still another object of the present invention to provide a printed circuit board having fine circuit lines formed by the simplified method.

It is still another object of the present invention to provide an apparatus which may form the printed circuit board.

One aspect of the present invention provides a method of surface treatment on a substrate, wherein a surface treatment solution including an alkali metal compound is discharged on a base film in accordance with circuit patterns by a discharging method. The alkali metal compound may be selected from the group consisting of KOH, NaOH, LiOH and a mixture thereof. The discharging method may be an inkjet printing method. According to a preferred embodiment, an ink-jet printer head used in the ink-jet printing method has a nozzle diameter of 1 to 80 µm and the base film may be a polyimide film.

Another aspect of the present invention provides a method for forming circuit lines on a substrate, wherein the method may comprise the steps of (a) selectively applying a surface treatment solution which includes an alkali metal compound on a base film in accordance with circuit patterns by a discharging method, (b) applying a conductive ink which includes metal nanoparticles in accordance with the surface treated circuit patterns, and (c) curing the base film on which the conductive ink is applied under reduction atmosphere. The step (b) may be performed simultaneously while the step (a) is performed. According to a preferred embodiment, the base film may be a polyimide film, and the discharging method may use an ink-jet printer. The ink-jet printer may comprise a plurality of ink-jet printer heads, wherein the plurality of ink-jet printer heads may comprise an ink-jet printer head for the surface treatment, which discharges a surface treatment solution including an alkali metal compound, and an inkjet printer head for the conductive ink, which discharges a conductive ink. The ink-jet printer head for the surface treatment and the ink-jet printer head for the conductive ink may operate independently in corresponding to different action control signals from each other, and discharge the surface treatment solution and the conductive ink, respectively.

A nozzle size of the ink-jet printer head for the surface treatment may be smaller than that of the ink-jet printer head for the conductive ink or discharging frequencies of the ink-jet printer head for the surface treatment and the ink-jet printer head for the conductive ink may be different.

According to a preferred embodiment, the nozzle diameter of the ink-jet printer head for the surface treatment is smaller than the nozzle diameter of the ink-jet printer head for the conductive ink by from 1 to 20 µm. And the alkali metal compound is selected from the group consisting of KOH, NaOH, LiOH and a mixture thereof.

Further another aspect of the present invention provides a printed circuit board having fine circuit lines formed by the steps of (a) selectively applying the surface treatment solution which includes an alkali metal compound on a base film in accordance with circuit patterns by a discharging method, (b) applying a conductive ink which includes metal nanoparticles in accordance with the surface treated circuit patterns, and (c) curing the base film on which the conductive ink is applied under a reduction atmosphere.

Further another aspect of the present invention provides an apparatus for forming circuit lines on a substrate. The apparatus comprises an ink-jet printer head for the surface treatment which discharges a surface treatment solution and an ink-jet printer head for the conductive ink which discharges a conductive ink including metal nanoparticles, wherein the ink-jet printer head for the surface treatment and the ink-jet printer head for the conductive ink simultaneously discharge the surface treatment solution and the conductive ink, respectively.

The ink-jet printer head for the surface treatment and the ink-jet printer head for the conductive ink operate independently in corresponding to different action control signals from each other, and discharge the surface treatment solution and the conductive ink, respectively. The nozzle size of the ink-jet printer head for the surface treatment is smaller than that of the ink-jet printer head for the conductive ink or discharging frequencies of the ink-jet printer head for the surface treatment and the ink-jet printer head for the conductive ink may be different.

According to a preferred embodiment, the nozzle diameter of the ink-jet printer head for the surface treatment is smaller than that of the ink-jet printer head for the conductive ink by from 1 to 20 μm.

DETAILED DESCRIPTION OF THE PREFERRED EMBODIMENTS

Prior to describe embodiments of the present invention, firstly, examples of a surface treatment on a substrate and reactions which can occur during the surface treatment are described.

The method of the surface treatment for forming conductive circuit lines can be divided broadly by a dry method and a wetting method. The wetting method is generally used compared to the dry method because of ease reaction and low cost. Due to rapid surface treatment of the wetting method, there has been a great deal of development research on alkali treatments using an alkali solution.

In accordance with a preferred embodiment, in case that the base film is a polyimide film and the surface treatment solution is a KOH solution, it will describe reactions which can occur on the surface of the substrate.

Referring to Chemical Equation 1, when a polyimid film is treated with a KOH alkali solution, the polyimid ring is opened by hydrolysis.

-Chemical Equation 1

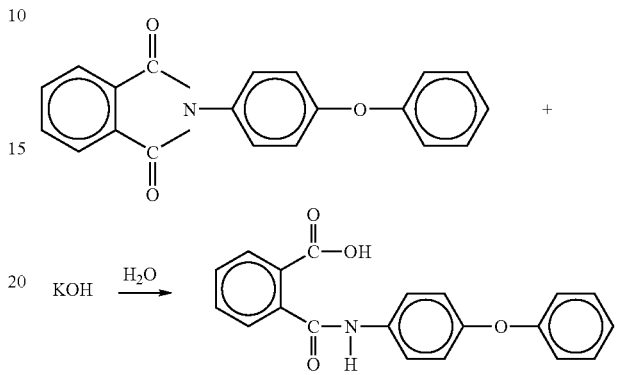

The opened-polyimid ring is then unstable, so that it reacts again with KOH. Referring to Chemical Equation 2, the opened-polyimide in Chemical Equation 1 becomes polyamate by an acid-base reaction.

-Chemical Equation 2

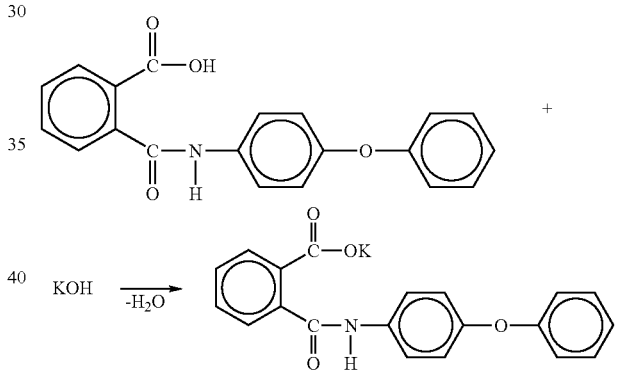

When the surface of the polyimide is polyamate, a conductive ink is applied thereon. This is because if the conductive ink is applied when polar groups are introduced on the surface of the polyimide film, it can improve a bonding power between the conductive ink and the film.

After applying the ink, the substrate is cured under a reduction atmosphere. In case that hydrochloric acid is used as a reduction condition, the reaction as Chemical Equation 3 may occur on the surface of the film. Referring to Chemical Equation 3, the polyamate of the film surface becomes stable polyamic acid by a protonation.

-Chemical Equation 3

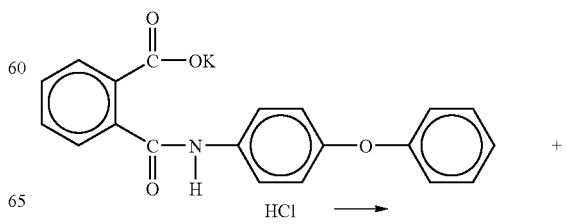

-continued

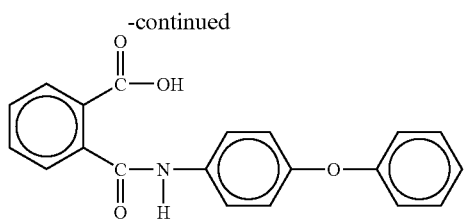

Hereinafter, preferred embodiments of the surface treatment method, circuit lines formation method, and circuit lines formation apparatus of a substrate and the printed circuit board according to the invention will be described in more detail with reference to the accompanying drawings. In the description with reference to the accompanying drawings, those components are rendered the same reference number that are the same or are in correspondence regardless of the figure number, and redundant explanations are omitted lines.

The "simultaneously" "perform simultaneously" or "discharge simultaneously" mean that it is possible to discharge the surface treatment solution and the conductive ink not only at the same time but also by using a plurality of ink-jet heads in accordance with a preset program.

Figure 1:
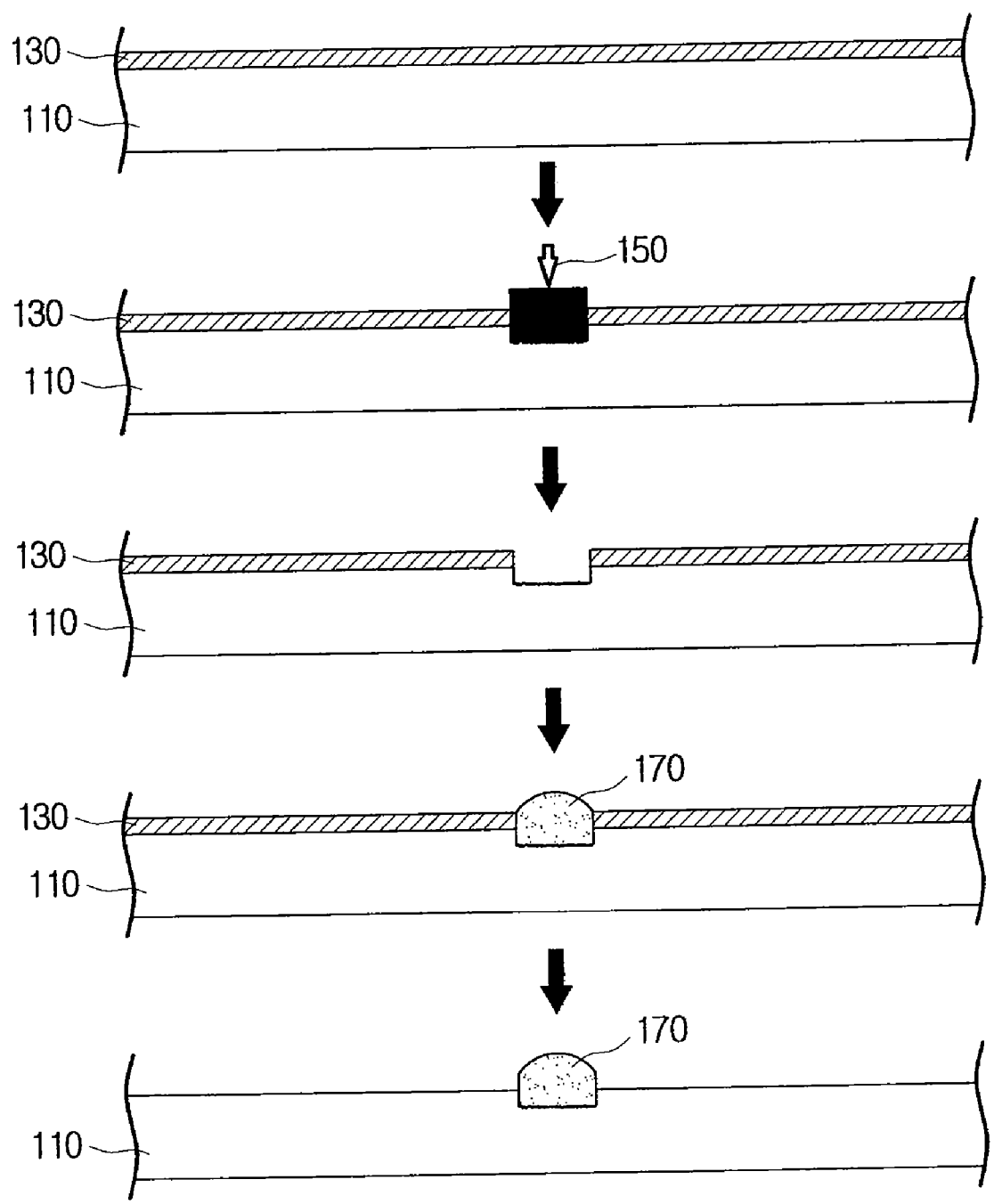
FIG. 1 shows cross-sectional views of a substrate for forming circuit lines on a printed circuit board in accordance with a conventional process.
Figure 2:
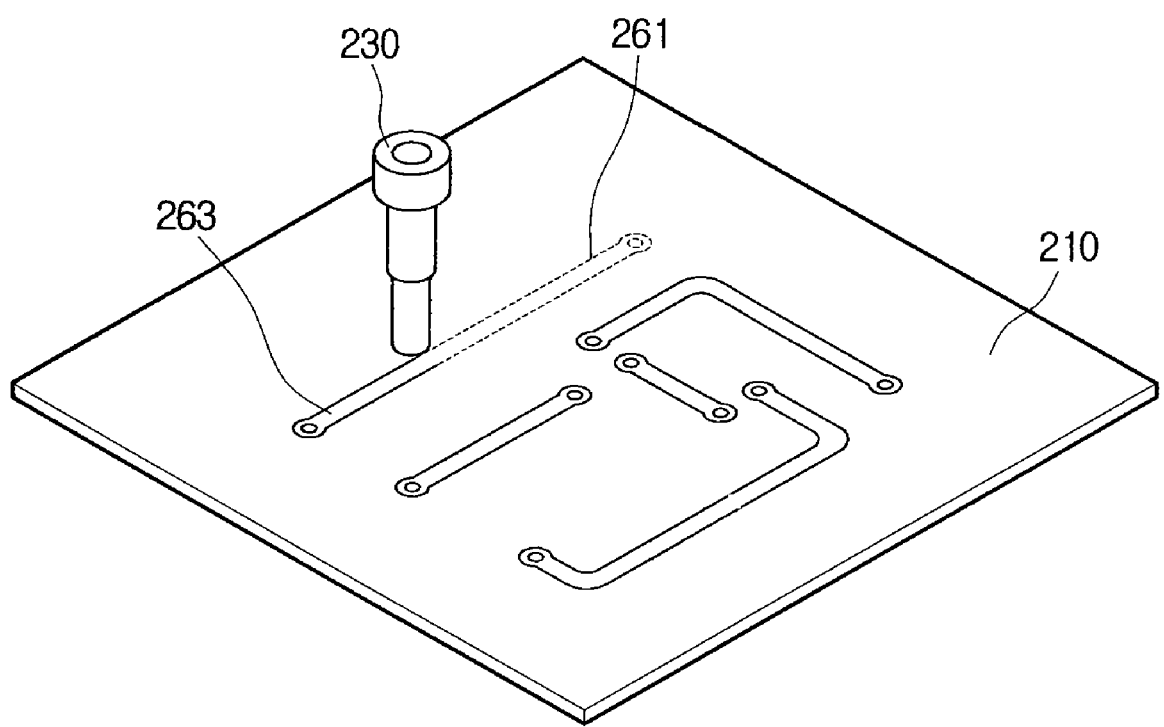
FIG. 2 is a perspective view illustrating a method of the surface treatment on a substrate in accordance with a preferred embodiment of the present invention.

FIG. 2 is a perspective view illustrating a method of the surface treatment of a substrate in accordance with a preferred embodiment of the present invention. Referring to FIG. 2, a surface treatment solution is discharged on base film 210 in accordance with a preset circuit pattern 261 by an inkjet printer including an ink-jet printer head 230 for the surface treatment solution. Surface treated circuit lines 263 on the base film 210 are formed.

Unlike a conventional method which treats a whole surface of a base film, the surface treatment of the present invention allows selective surface treatment of the base film since circuit patterns can be formed by using an ink-jet printer. Also, it does not require photo-resistor or elimination of water repellent film, so that it allows simple and low-cost surface treatment. It further allows selective surface treatment in accordance with fine circuit lines by controlling nozzle size of an ink-jet printer or discharging frequency of an ink-jet printer head.

Figure 3:
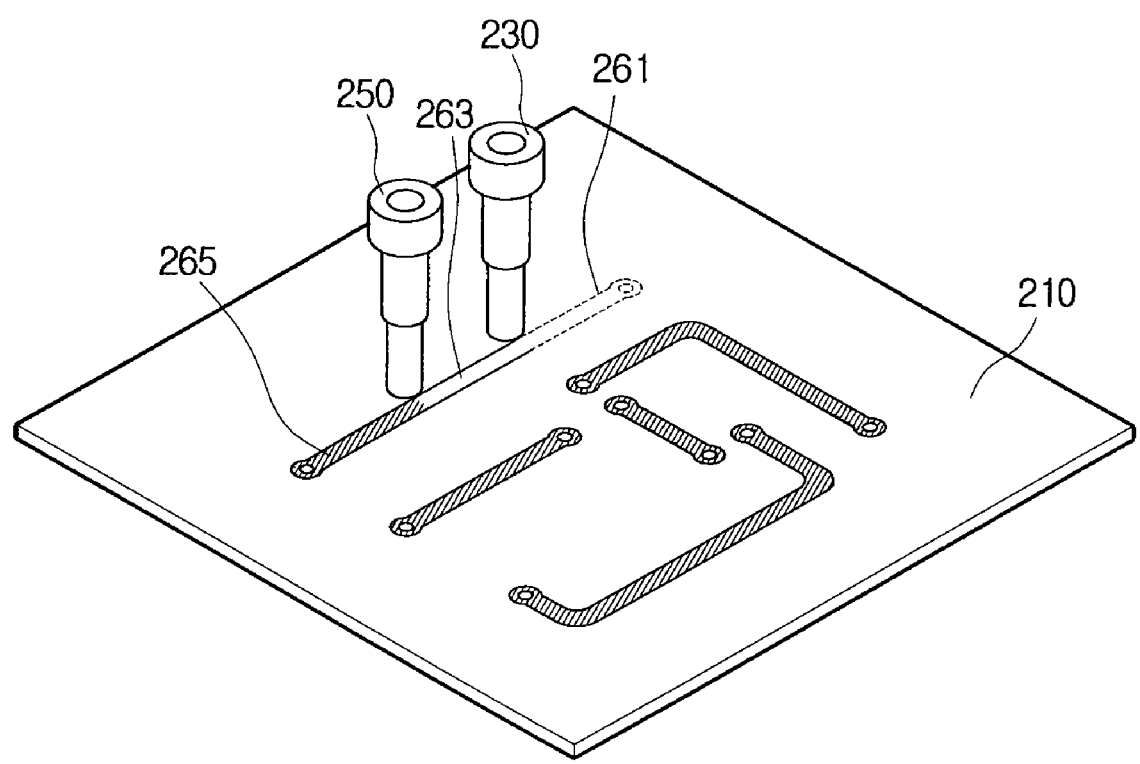
FIG. 3 is a perspective view illustrating a method for forming circuit lines in accordance with a preferred embodiment of the present invention.

FIG. 3 is a perspective view illustrating a method for forming circuit lines of a substrate in accordance with a preferred embodiment of the present invention. Referring FIG. 3, the surface treatment solution is discharged on the base film 210 in accordance with the preset circuit pattern 261 by the ink-jet printer including the inkjet printer head for the surface treatment 230. The surface treated circuit lines 263 was then formed on the base film 210. A conductive ink 270 which includes metal nanoparticles is discharged on the surface treated circuit lines 263 by an ink-jet printer including an ink-jet printer head for the conductive ink 250. The circuit lines 265 applied with the conductive ink is then formed on the base film 210.

Figure 4:
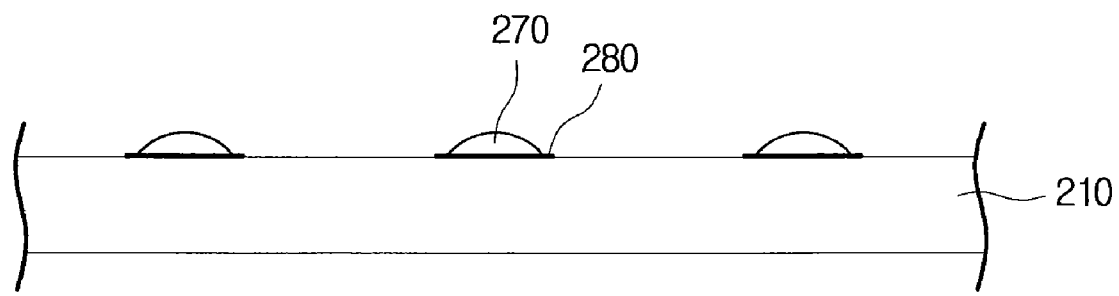
FIG. 4 shows a cross-sectional view of the circuit lines before curing in accordance with a preferred embodiment of the present invention.
Figure 5:
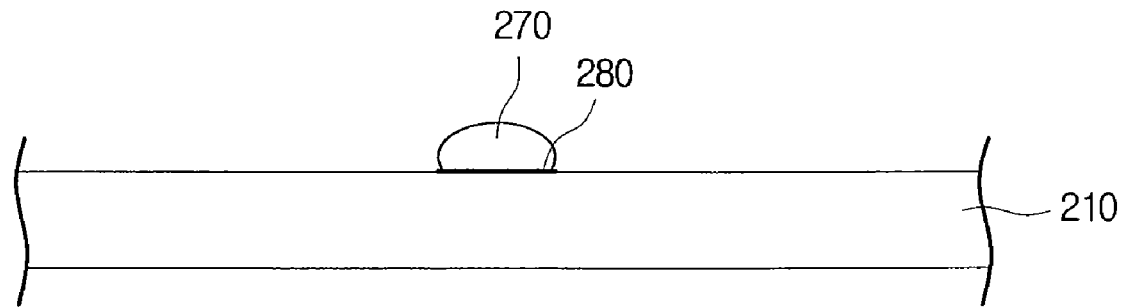
FIG. 5 shows a cross-sectional view of the circuit lines before curing in accordance with another preferred embodiment of the present invention.

FIG. 4 shows a cross-sectional view of circuit lines, before curing, formed in accordance with a preferred embodiment of the invention and FIG. 5 shows a cross-sectional view of circuit lines, before curing, formed in accordance with another preferred embodiment of the present invention. Referring to FIG. 4 and FIG. 5, a surface treatment solution 280 layer is formed on the base film 210 and a conductive ink 270 layer is then formed on the surface treatment solution 280 layer. The surface treatment solution 280 layer forms the surface treated circuit lines 263, by the ink-jet printer head for the surface treatment 230. The conductive ink 270 layer forms the conductive circuit lines 265, by the ink-jet printer head for the conductive ink 250. FIG. 4 shows that a drop size of the surface treatment solution 280 on the surface of the base film is bigger than that of the conductive ink 270. FIG. 5 shows that a drop size of the surface treatment solution 280 on the surface of the base film is smaller than that of the conductive ink 270.

After the surface treatment as described above, the base film 210 having the conductive ink-discharged circuit lines 265 is cured under reduction atmosphere to produce conductive circuit lines. The step of curing can be performed by the general method in the field of the manufacturing printed circuit board, but is not limited to a particular method.

According to a preferred embodiment of the invention, the surface treatment and discharging the conductive ink may be performed simultaneously by arrange the ink-jet printer head for the surface treatment 230 and the ink-jet printer head for the conductive ink 250 in series. Here, the term of "performed simultaneously" means that not only the surface treatment solution 280 and the conductive ink 270 can be discharged at the same time, but also the surface treatment solution 280 and the conductive ink 270 can be discharged in accordance with a preset program by employing a plurality of ink-jet printer heads. Referring to FIG. 3, the ink-jet printer head for the surface treatment 230 and the ink-jet printer head for the conductive ink 250 move by facing the base film 210 and simultaneously discharge the surface treatment solution and the conductive ink, respectively, Herein, there may be an interval of time in discharging the ink-jet printer head for the surface treatment 230 and the discharging of the ink-jet printer head for the conductive ink 250, to provide time for forming polyamates on the surface treated circuit lines by a reaction between alkali solution and polyimide.

The surface treatment solution and the conductive ink may simultaneously be discharged, respectively, through the ink-jet printer head for the surface treatment 230 and the ink-jet printer head for the conductive ink 250 arranged by having a certain distance to provide time for forming polyamates on the surface treated circuit lines by a reaction between alkali solution and polyimide.

Such ink-jet printer head for the surface treatment 230 and ink-jet printer head for the conductive ink 250 may be a head of an ink-jet printer apparatus for lines discharging. For example, the ink-jet printer apparatus lines may comprise a support which supports the apparatus; an ink-jet printer head which discharges the surface treatment solution and the conductive ink, respectively, along with a pre-set circuit pattern 261 on the base film; a moving part which moves the ink-jet printer head on the base film 210; a circuit part which performs a program to control discharging of inks along with the preset circuit pattern; and the like.

In accordance with a preferred embodiment of the present invention, the ink-jet printer head for the surface treatment 230 and the ink-jet printer head for the conductive ink 250 moves together and simultaneously discharge the surface treatment solution and the conductive ink, respectively. Therefore, these ink-jet printer heads can discharge the surface treatment solution and the conductive ink, respectively, by moving together over the same path of the base film in accordance with the preset circuit pattern. When the ink-jet printer heads move, it is possible to control discharging position or discharging amount of the surface treatment solution and the conductive ink from each head, so that the surface treatment solution and the conductive ink may be discharged in accordance with the preset program.

In accordance with another preferred embodiment of the present invention, the ink-jet printer head for the surface treatment 230 and the ink-jet printer head for the conductive ink 250 move individually in corresponding to a different moving control signal and may discharge the surface treatment solution and the conductive ink, respectively, That is, each ink-jet printer head may be equipped in one apparatus or separate apparatuses, and may be moved independently in corresponding to its own different moving control signal by different programs.

It is also possible to use simultaneously a plurality of the ink-jet printer heads of the surface treatment 230 and a plurality of the ink-jet printer heads for the conductive ink 250.

Nozzle sizes of the ink-jet printer head of the surface treatment 230 and the ink-jet printer head for the conductive ink 250 should be suitable to form fine circuit lines. Recently, there is a demand to be a diameter of the nozzle of the ink-jet printer head under several tens μm to form fine circuit lines which have the width under several tens μm. The nozzle diameter of the ink-jet printer head used in the present invention is from 1 to 80 μm, preferably about 20 μm. In case that the nozzle size is 80 μm or above, it is not suitable for forming the fine circuit lines. In case that the nozzle size is under 1 μm, it is difficult to discharge the surface treatment solution or the conductive ink.

Referring to FIG. 4, a drop size of the surface treatment solution is different from that of the conductive ink. Having same drop sizes of the surface treatment solution and the conductive ink is ideal. But, the drop size of the surface treatment solution is generally bigger than the drop size of the conductive ink due to different viscosities between the surface treatment solution and the conductive ink. If the drop size of the surface treatment solution is excessively bigger than the drop size of the conductive ink, it cannot form desired circuit lines because the conductive ink cannot be gathered lines. Referring to FIG. 5, if the drop size of the surface treatment solution is excessively smaller than the drop size of the conductive ink, the conductive ink cannot bond stably to the substrate. Therefore, a diameter of the drop size of the surface treatment solution may preferably be from 0.6 to 1.5 times a diameter of the drop size of the conductive ink.

In accordance with a preferred embodiment of the present invention, the nozzle size of the ink-jet printer head for the surface treatment may be smaller than the nozzle size of the ink-jet printer head for the conductive ink to allow a difference of the drop size between the surface treatment solution and the conductive ink to be in the above range. That is, the nozzle size of the ink-jet printer head for the surface treatment 230 providing a bigger drop size can be reduced, so that the drop size of the surface treatment solution becomes smaller. According to a preferred embodiment, when the nozzle diameter of the ink-jet printer head for the surface treatment is smaller than the nozzle diameter of the ink-jet printer head for the conductive ink by from 1 to 20 μm, the drop size of the surface treatment solution can be in the range from 0.6 to 1.5 times to the drop size of the conductive ink.

In accordance with another preferred embodiment of the present invention, the drop sizes of the surface treatment solution and the conductive ink may be controlled by employing different discharging frequencies to allow a difference of the drop size between the surface treatment solution and the conductive ink to be within the preferred range even if the nozzle sizes of diameter of the ink-jet printer head for the surface treatment and the ink-jet printer head for the conductive ink are identical.

In accordance with the other preferred embodiment of the present invention, the difference of the drop size can be controlled by changing waveform shapes or waveform steps of discharging pressure or absorption pressure to allow a difference of the drop size between the surface treatment solution and the conductive ink to be within the preferred range.

In accordance with another preferred embodiment of the present invention, a dot number of the surface treatment solution and the conductive ink which is discharged respectively per 1 inch of the circuit pattern may be controlled to make a difference of the drop size between the surface treatment solution and the conductive ink.

Figure 6:
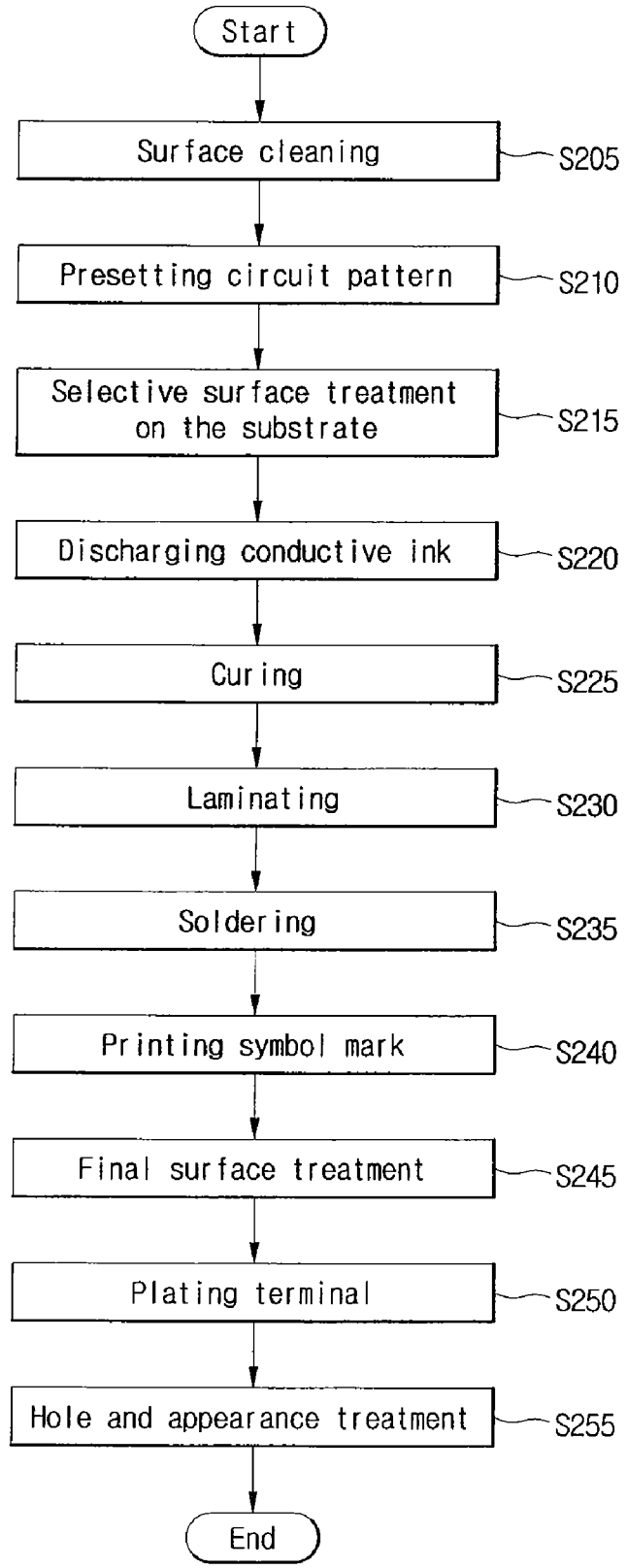
FIG. 6 is a flow diagram illustrating a process of manufacturing a printed circuit board in accordance with a preferred embodiment of the present invention.

FIG. 6 is a flow diagram illustrating a process of manufacturing a printed circuit board in accordance with a preferred embodiment of the present invention. Referring to FIG. 6, surface of the base film 210 is cleaned for following steps in S205, and a circuit pattern is preset for next steps of surface treatment by means of a general method in this technical field. In S215, the surface treatment solution is selectively applied in accordance with the circuit pattern on the base film by a discharging method. This step is described in detail in the following embodiment. In S220, a conductive ink including nanoparticles is applied, so that the ink-applied circuit lines 265 is formed on the surface-treated one. This step is also described in detail in the following embodiment In S225, the base film having circuit lines formed in S215 and S220 is cured under a reduction atmosphere.

A desired number of the substrate is laminated for forming multilayer printed circuit board, which includes copper layer or dielectric layer in S230. A soldering process forms a solder resist layer to prevent any undesired contact with external parts on the formed conductive circuit lines in S235. Symbol marks, for example part name and part position, are printed on the substrate in S240, and a final surface treatment such as a HASL process is performed in S245. A terminal is plated in S250, and hole and appearance treatment are performed to produce a printed circuit board in S255.

Use of the printed circuit board (PCB) manufactured in accordance with the method of the present invention is not limited, and it may be used in manufacturing printed circuit boards which include a polyimide film such as a flexible printed circuit board (FPCB).

Embodiments

Hereinafter, an embodiment of the method of surface treatment, the method for forming circuit lines, the printed circuit board formed thereby, and the apparatus for forming circuit lines on a substrate according to the present invention will be described in more detail with accordance to each condition of the steps.

1) Base film

A base film 210 is generally an organic dielectric material. The organic dielectric material requires relatively high elasticity, lower hygroscopic swelling coefficient, and lower linear expansion coefficient. When the hygroscopic swelling coefficient of the organic dielectric material is high, a PCB manufactured by using such an organic dielectric material easily bends or produces curls with changes of external circumstances, such as temperature or humidity. FPCBs for PDP which have a wider area compared to other uses specially require a high dimensional stability of the base film. In order to use an organic dielectric material as the base film, it is preferred to have heat resistance, appropriate elasticity, flexibility, appropriate hygroscopic swelling coefficient, and appropriate linear expansion coefficient. The preferred organic dielectric material having such properties is polyimide, but not limited to it.

The method of the surface treatment of a substrate of the present invention is exampled for the base film used in FPCBs for PDP, but is not limited thereto. The base film may be used in circuit lines or method for forming circuit lines of substrates below to be described.

2) Surface treatment condition (1) Surface treatment solution and additives

Studies using alkali solutions as a surface treatment solution have been extensively increased. The alkali solution includes an alkali metal (that is elements of 1A row of the periodic table) compound, preferably KOH, NaOH, LiOH and a mixture of thereby. In accordance with a preferred embodiment, the surface treatment solution may also include additives by 40 volume % in the total surface treatment solution. Example of the additives include ethylene glycol, di(ethylene glycol) butyl ether, 1-butanol, terpinol, α-terpinol, propylene glycol, methanol, ethanol, propanol, butanol, isobutanol, 2-(isopropylamino) ethanol, ethylene diamene, glycerol, hexyl alcohol, 2-methyl-2,4-pentandiol, acetonitrile, ethylene glycol butyl ether, 1-methyl-2-pyrrolidione, diethylene glycol diethyl ether, diethylene glycol, proethylene glycol, xylene, toluene, tetradecane, dodecane, propylene glycol, triethylene glycol, dipropylene glycol, hexylene glycol, butylene glycol, methyl ethyl ether and so on. These additives can be added depending on a desired condition since they control viscosity, adhesion to the surface of the base film, spread rate of the surface treatment solution, evaporation rate, and the like.

(2) Concentration of the surface treatment solution

In case that KOH is selected as the surface treatment solution, the concentration of KOH is preferred from 0.1 to 10M, more preferred 1M. It is scarcely any effect of the surface treatment on a polyimide film when the concentration of the KOH is under 0.1M. It is not preferred because the property of the polyimide film may be changed when the concentration of the KOH is over 10M. According to a preferred embodiment, in case that the thickness of the polyimide film is 25 μm, over 10 μm of the polyimide film surface is reformed when the concentration of the surface treatment solution is over 10M. As a result, it becomes difficult to control the polyimide film.

(3) Surface treatment time

It is preferable that the surface treatment time be a time to form polyamates by reacting polyimides with KOH solution on the surface of the polyimide film. The conductive ink is discharged after the polyamates are formed from polyimides, so that the corresponding conductive circuit lines may be obtained. In accordance with the preferred embodiment of the present invention, the surface treatment time is preferred from to 1 to 20 minutes, more preferred from 3 to 10 minutes. Enough ployamates are not formed when it is under 1 minute. On the other hand when it is more than 20 minutes, further polyamates are not formed due to stabilized reaction state on the surface of the polyimide.

(4) Surface treatment temperature

The temperature of the surface treatment is preferred in the range from 3 to 80° C. It may be difficult to discharge the surface treatment solution or the conductive ink from the nozzle of the ink-jet printer because the viscosity thereof becomes low when the temperature is under 3☐. The chemical property of the KOH solution may be changed and especially, compounds of the conductive ink may react each other when the temperature is over 80° C.

(5) Surface treatment pressure

It is preferred that the discharging of the surface treatment solution is performed under 0.8 to 1.5 atm pressure. In case that the pressure is out of the range, it is difficult to maintain the straightness of the surface treatment solution and control the drop size. Also, the surface treatment may be performed under air or nitrogen atmosphere. In the case of the surface treatment under nitrogen atmosphere, it is required a flow control of the surface treatment solution.

Herein, the alkali solution is not limited to KOH, it is apparent that NaOH or LiOH solution may be used.

3) Conductive ink

It is not limited especially the kind of metal nanoparticles included the conductive ink to form the fine circuit lines. Examples of the metal of the metal nanoparticles include gold, silver, copper, platinum, chromium, nickel, aluminum, titanium, palladium, tin, vanadium, zinc, manganese, cobalt, zirconium, and the like. These metals can be used also as a mixture of 2 or more. It is preferred gold, silver, copper and nickel among examples. The conductive ink is a colloid which the metal nanoparticles are dispersed by a dispersing agent. The preferred viscosity of the conductive ink for fine circuit printing is from 1 to 50 cps.

4) Reduction atmosphere

An acid such as acetic acid, formic acid, and hydrochloric acid may be used for forming the reduction atmosphere. Under the reduction atmosphere, polyamates become their stable state of the corresponding polyamic acid.

5) Discharging method

'Discharging method' is a printing method which jets or discharges a desired low viscosity solution or colloid on an object by using nozzle or needle. A preferred method is an ink-jet printing method which uses the ink-jet printer. Herein, the ink-jet printing method is divided broadly by Piezo method and Thermal method in accordance with driving mechanism of the ink-jet printer head, but it is not limited to these methods. If a concentration of the surface treatment solution is controlled, an ink-jet printer for OA may also be possible.

Here, number or kind of ink-jet printer heads, nozzle size of ink-jet printer heads and the like are described in detail in the above-mentioned embodiment, so that descriptions relating thereto will be omitted.

The foregoing detailed description is intended to be illustrative rather than limiting, and the scope of the invention is to be measured by the following claims, including any equivalents thereto.

What is claimed is:

1. A method for forming circuit lines on a substrate comprising the steps of:
   (a) selectively applying a surface treatment solution which includes an alkali metal compound on a base film in accordance with circuit patterns by a discharging method;
   (b) applying a conductive ink which includes metal nanoparticles in accordance with the surface-treated circuit pattern; and
   (c) curing the base film on which the conductive ink is applied under a reduction atmosphere.

2. The method as claimed in claim 1, wherein said alkali metal compound is selected from the group consisting of KOH, NaOH, LiOH and a mixture thereof.

3. The method as claimed in claim 1, wherein said step (b) may be performed simultaneously while said step (a) is performed.

4. The method as claimed in claim 1, wherein said base film is a polyimide film.

5. The method as claimed in claim 1, wherein said discharging method uses an ink-jet printer.

6. The method as claimed in claim 5, wherein an ink-jet printer used in said ink-jet printer comprises a plurality of ink-jet printer heads, wherein said plurality of ink-jet printer heads comprise an ink-jet printer head for the surface treatment which discharges the surface treatment solution, and an ink-jet printer head for the conductive ink which discharges the conductive ink.

7. The method as claimed in claim 6, wherein said ink-jet printer head for the surface treatment and said ink-jet printer head for the conductive ink operate independently in corresponding to different action control signals, and discharge the surface treatment solution and the conductive ink, respectively.

8. The method as claimed in claim 6, wherein a nozzle size of said ink-jet printer head for the surface treatment is smaller than a nozzle size of said ink-jet printer head for the conductive ink.

9. The method as claimed in claim 8, wherein a nozzle diameter of said ink-jet printer head for the surface treatment is smaller than a nozzle diameter of said ink-jet printer head for the conductive ink by from 1 to 20 μm.

10. The method as claimed in claim 6 or claim 7, wherein a discharging frequency of said ink-jet printer head for the surface treatment is different from a discharging frequency of said ink-jet printer head for the conductive ink.

* * * * *